(12) United States Patent
McCormick et al.

(10) Patent No.: US 9,876,369 B2
(45) Date of Patent: Jan. 23, 2018

(54) BATTERY SYSTEM AND METHOD FOR DETERMINING AN OPEN CIRCUIT FAULT CONDITION IN A BATTERY MODULE

(71) Applicant: LG Chem, Ltd., Seoul (KR)

(72) Inventors: Richard McCormick, Troy, MI (US); Christopher E. Curtis, Rochester, MI (US)

(73) Assignee: LG Chem, Ltd., Seoul (KR)

( * ) Notice: Subject to any disclaimer, the term of this patent is extended or adjusted under 35 U.S.C. 154(b) by 200 days.

(21) Appl. No.: 15/070,834

(22) Filed: Mar. 15, 2016

(65) Prior Publication Data

US 2017/0271888 A1 Sep. 21, 2017

(51) Int. Cl.
*H02J 7/00* (2006.01)
*G01R 31/00* (2006.01)
*G01R 31/36* (2006.01)

(52) U.S. Cl.
CPC ........ *H02J 7/0014* (2013.01); *G01R 31/3696* (2013.01); *H02J 7/0004* (2013.01); *H02J 7/0016* (2013.01); *H02J 7/0024* (2013.01)

(58) Field of Classification Search
CPC ........ H02J 7/0014; H02J 7/004; H02J 7/0016; H02J 7/0024; G01R 31/3696
USPC ........ 320/128, 134, 136, 149, 157, 164, 165
See application file for complete search history.

(56) References Cited

U.S. PATENT DOCUMENTS

| | | | |
|---|---|---|---|
| 9,000,771 B2 | 4/2015 | Owens et al. | |
| 2010/0209748 A1 | 8/2010 | Kudo et al. | |
| 2011/0156650 A1 | 6/2011 | Yang et al. | |
| 2011/0172940 A1* | 7/2011 | Wood | G01R 31/362 702/63 |
| 2012/0025835 A1* | 2/2012 | Chandler | G01R 19/16542 324/433 |
| 2012/0025836 A1 | 2/2012 | Furukawa | |

(Continued)

FOREIGN PATENT DOCUMENTS

| | | |
|---|---|---|
| JP | 2010193589 A | 9/2010 |
| KR | 1020110075225 A | 7/2011 |

(Continued)

OTHER PUBLICATIONS

International Search Report for International application No. PCT/KR2017/002669 dated Mar. 13, 2017.

*Primary Examiner* — Phallaka Kik
(74) *Attorney, Agent, or Firm* — Buckert Patent & Trademark Law Firm PC; John F. Buckert

(57) ABSTRACT

A battery system and a method for determining an open circuit fault condition in a battery module are provided. The method includes measuring a first voltage between first and second electrical sense lines while a first transistor in a first cell balancing circuit is turned off, and measuring a second voltage between the first and second electrical sense lines while the first transistor is turned on. The method further includes retrieving a first resistance value from a table stored in a memory device. The method further includes determining a first cell balancing current based on the first and second voltages and the first resistance value. The method further includes determining a first open circuit fault condition between the first battery cell and the first cell balancing circuit if the first cell balancing current is greater than a first threshold current.

12 Claims, 5 Drawing Sheets

(56) References Cited

U.S. PATENT DOCUMENTS

| | | | |
|---|---|---|---|
| 2012/0119709 A1* | 5/2012 | Mull | H02J 7/0016 320/149 |
| 2012/0195103 A1* | 8/2012 | Kajigaya | G11C 11/4091 365/149 |
| 2012/0274331 A1 | 11/2012 | Liu et al. | |
| 2013/0018606 A1 | 1/2013 | White et al. | |
| 2016/0064969 A1* | 3/2016 | Pernyeszi | H02J 7/0014 320/118 |
| 2017/0244258 A1* | 8/2017 | Yao | H02J 7/0019 |

FOREIGN PATENT DOCUMENTS

| | | |
|---|---|---|
| KR | 1020120012439 A | 2/2012 |
| KR | 1020140053192 | 5/2014 |

* cited by examiner

| BATTERY CELL | AVERAGE RESISTANCE (MILLI-OHMS) | |
|---|---|---|
| 1 | 0.236 | 452 |
| 2 | 0.226 | 454 |

FIG. 2

```
USER PROVIDES A BATTERY MODULE AND A COMPUTER, THE BATTERY MODULE HAVING FIRST AND SECOND
BATTERY CELLS, FIRST AND SECOND CELL BALANCING CIRCUITS; THE FIRST BATTERY CELL HAVING FIRST
AND SECOND ELECTRICAL TERMINALS, THE FIRST ELECTRICAL TERMINAL OF THE FIRST BATTERY CELL BEING
ELECTRICALLY COUPLED TO A FIRST ELECTRICAL SENSE LINE IF THERE IS NOT AN OPEN CIRCUIT FAULT
CONDITION THEREBETWEEN, THE SECOND ELECTRICAL TERMINAL OF THE FIRST BATTERY CELL BEING
ELECTRICALLY COUPLED TO A SECOND ELECTRICAL SENSE LINE IF THERE IS NOT AN OPEN CIRCUIT
FAULT CONDITION THEREBETWEEN; THE FIRST CELL BALANCING CIRCUIT BEING ELECTRICALLY COUPLED
TO THE FIRST AND SECOND ELECTRICAL SENSE LINES, THE FIRST CELL BALANCING CIRCUIT HAVING
A FIRST TRANSISTOR THEREIN; THE SECOND BATTERY CELL HAVING FIRST AND SECOND ELECTRICAL
TERMINALS, THE FIRST ELECTRICAL TERMINAL OF THE SECOND BATTERY CELL BEING ELECTRICALLY
COUPLED TO THE SECOND ELECTRICAL SENSE LINE IF THERE IS NOT AN OPEN CIRCUIT FAULT
CONDITION THEREBETWEEN, THE SECOND ELECTRICAL TERMINAL OF THE SECOND BATTERY CELL
BEING ELECTRICALLY COUPLED TO A THIRD ELECTRICAL SENSE LINE IF THERE IS NOT AN OPEN CIRCUIT
FAULT CONDITION THEREBETWEEN; THE SECOND CELL BALANCING CIRCUIT BEING ELECTRICALLY
COUPLED TO THE SECOND AND THIRD ELECTRICAL SENSE LINES, THE SECOND CELL BALANCING
CIRCUIT HAVING A SECOND TRANSISTOR THEREIN; THE COMPUTER BEING ELECTRICALLY
COUPLED TO THE FIRST, SECOND, AND THIRD ELECTRICAL SENSE LINES, AND TO THE FIRST AND
SECOND TRANSISTORS
```

(F)

COMPUTER MEASURES A FIRST VOLTAGE BETWEEN THE SECOND ELECTRICAL SENSE
LINE AND THE FIRST ELECTRICAL SENSE LINE WHILE THE FIRST TRANSISTOR IN THE FIRST
CELL BALANCING CIRCUIT IS TURNED OFF — 502

COMPUTER GENERATES A FIRST CONTROL SIGNAL TO TURN ON THE
FIRST TRANSISTOR IN THE FIRST CELL BALANCING CIRCUIT — 504

BATTERY SYSTEM AND METHOD FOR DETERMINING AN OPEN CIRCUIT FAULT CONDITION IN A BATTERY MODULE

BACKGROUND

The inventors herein have recognized a need for an improved battery system that detects an open circuit fault condition between a battery cell and a cell balancing circuit in a battery module.

SUMMARY

A battery system in accordance with an exemplary embodiment is provided. The battery system includes a battery module having a first battery cell, a first balancing circuit, a second battery cell, and a second balancing circuit. The first battery cell has first and second electrical terminals. The first electrical terminal of the first battery cell is electrically coupled to a first electrical sense line if there is not an open circuit fault condition therebetween. The second electrical terminal of the first battery cell is electrically coupled to a second electrical sense line if there is not an open circuit fault condition therebetween. The first cell balancing circuit is electrically coupled to the first and second electrical sense lines. The first cell balancing circuit has a first transistor therein. The second battery cell has first and second electrical terminals. The first electrical terminal of the second battery cell is electrically coupled to the second electrical sense line if there is not an open circuit fault condition therebetween. The second electrical terminal of the second battery cell is electrically coupled to a third electrical sense line if there is not an open circuit fault condition therebetween. The second cell balancing circuit is electrically coupled to the second and third electrical sense lines. The second cell balancing circuit has a second transistor therein. The battery system further includes a computer that is electrically coupled to the first, second, and third electrical sense lines, and to the first and second transistors. The computer is programmed to measure a first voltage between the second electrical sense line and the first electrical sense line while the first transistor in the first cell balancing circuit is turned off. The computer is further programmed to generate a first control signal to turn on the first transistor in the first cell balancing circuit. The computer is further programmed to measure a second voltage between the second electrical sense line and the first electrical sense line while the first transistor in the first cell balancing circuit is turned on. The computer is further programmed to retrieve a first resistance value from a table stored in a memory device. The first resistance value corresponds to a previously measured resistance level of a first conductive path coupled to and between the first battery cell and the first cell balancing circuit. The computer is further programmed to determine a first cell balancing current flowing through the first cell balancing circuit based on the first and second voltages and the first resistance value. The computer is further programmed to determine a first open circuit fault condition between the first battery cell and the first cell balancing circuit if the first cell balancing current is greater than a first threshold current.

A method for determining an open circuit fault condition in a battery module in accordance with another exemplary embodiment is provided. The method includes providing the battery module and a computer, the battery module having first and second battery cells, and first and second cell balancing circuits. The first battery cell has first and second electrical terminals. The first electrical terminal of the first battery cell is electrically coupled to a first electrical sense line if there is not an open circuit fault condition therebetween. The second electrical terminal of the first battery cell is electrically coupled to a second electrical sense line if there is not an open circuit fault condition therebetween. The first cell balancing circuit is electrically coupled to the first and second electrical sense lines. The first cell balancing circuit has a first transistor therein. The second battery cell has first and second electrical terminals. The first electrical terminal of the second battery cell is electrically coupled to the second electrical sense line if there is not an open circuit fault condition therebetween. The second electrical terminal of the second battery cell is electrically coupled to a third electrical sense line if there is not an open circuit fault condition therebetween. The second cell balancing circuit is electrically coupled to the second and third electrical sense lines. The second cell balancing circuit has a second transistor therein. The computer is electrically coupled to the first, second, and third electrical sense lines, and to the first and second transistors. The method includes measuring a first voltage between the second electrical sense line and the first electrical sense line while the first transistor in the first cell balancing circuit is turned off, utilizing the computer. The method further includes generating a first control signal to turn on the first transistor in the first cell balancing circuit utilizing the computer. The method further includes measuring a second voltage between the second electrical sense line and the first electrical sense line while the first transistor in the first cell balancing circuit is turned on, utilizing the computer. The method further includes retrieving a first resistance value from a table stored in a memory device, utilizing the computer. The first resistance value corresponds to a previously measured resistance level of a first conductive path coupled to and between the first battery cell and the first cell balancing circuit. The method further includes determining a first cell balancing current flowing through the first cell balancing circuit based on the first and second voltages and the first resistance value, utilizing the computer. The method further includes determining a first open circuit fault condition between the first battery cell and the first cell balancing circuit if the first cell balancing current is greater than a first threshold current, utilizing the computer.

BRIEF DESCRIPTION OF THE DRAWINGS

FIG. 2 is a schematic of an exemplary table utilized by the battery system of FIG. 1; and FIGS. 3-6 are flowcharts of a method for determining an open circuit fault condition in a battery module in the battery system of FIG. 1 in accordance with another exemplary embodiment.

DETAILED DESCRIPTION

Figure 1:
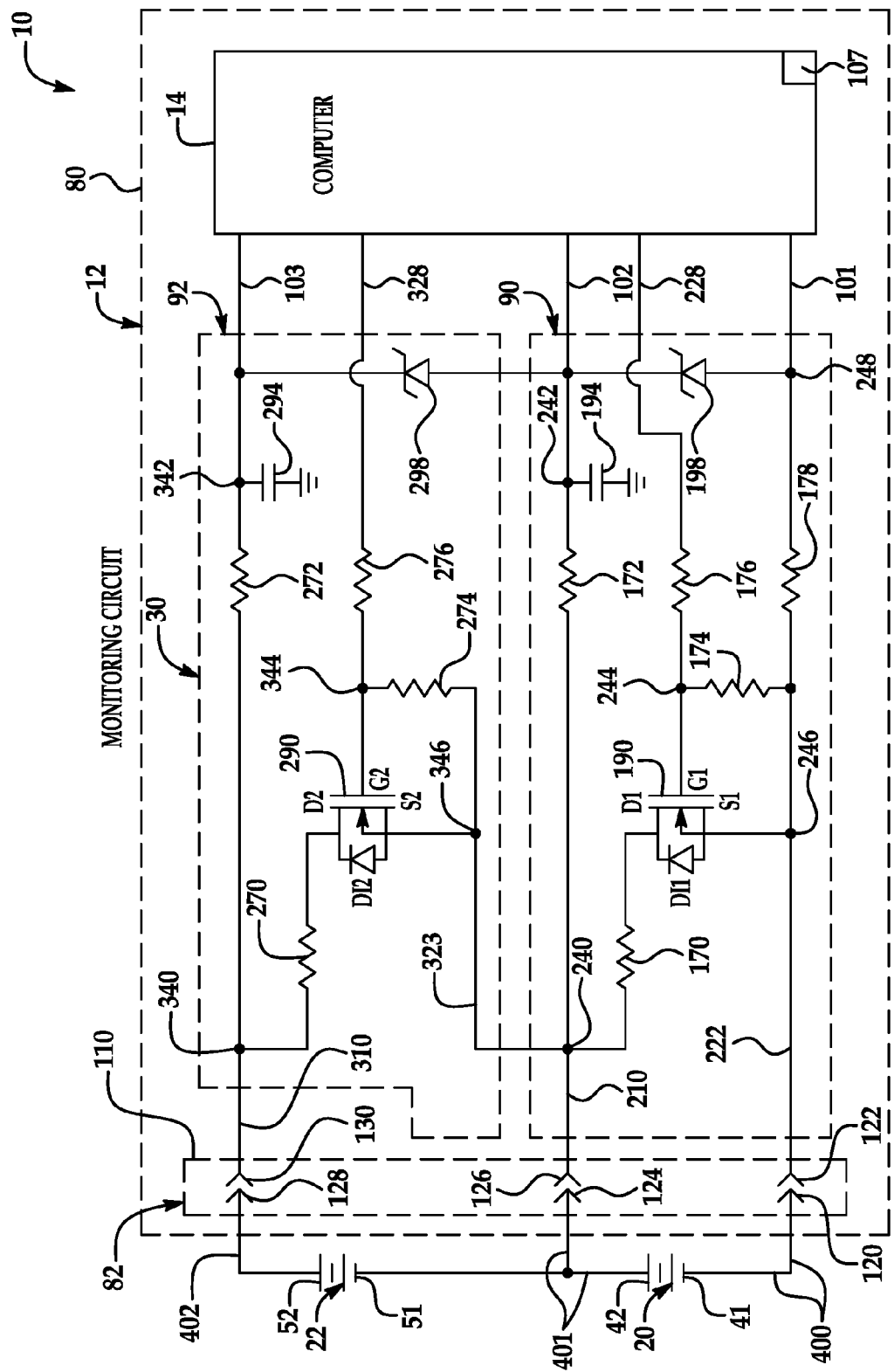
FIG. 1 is a schematic of a battery system in accordance with an exemplary embodiment.
Figure 4:
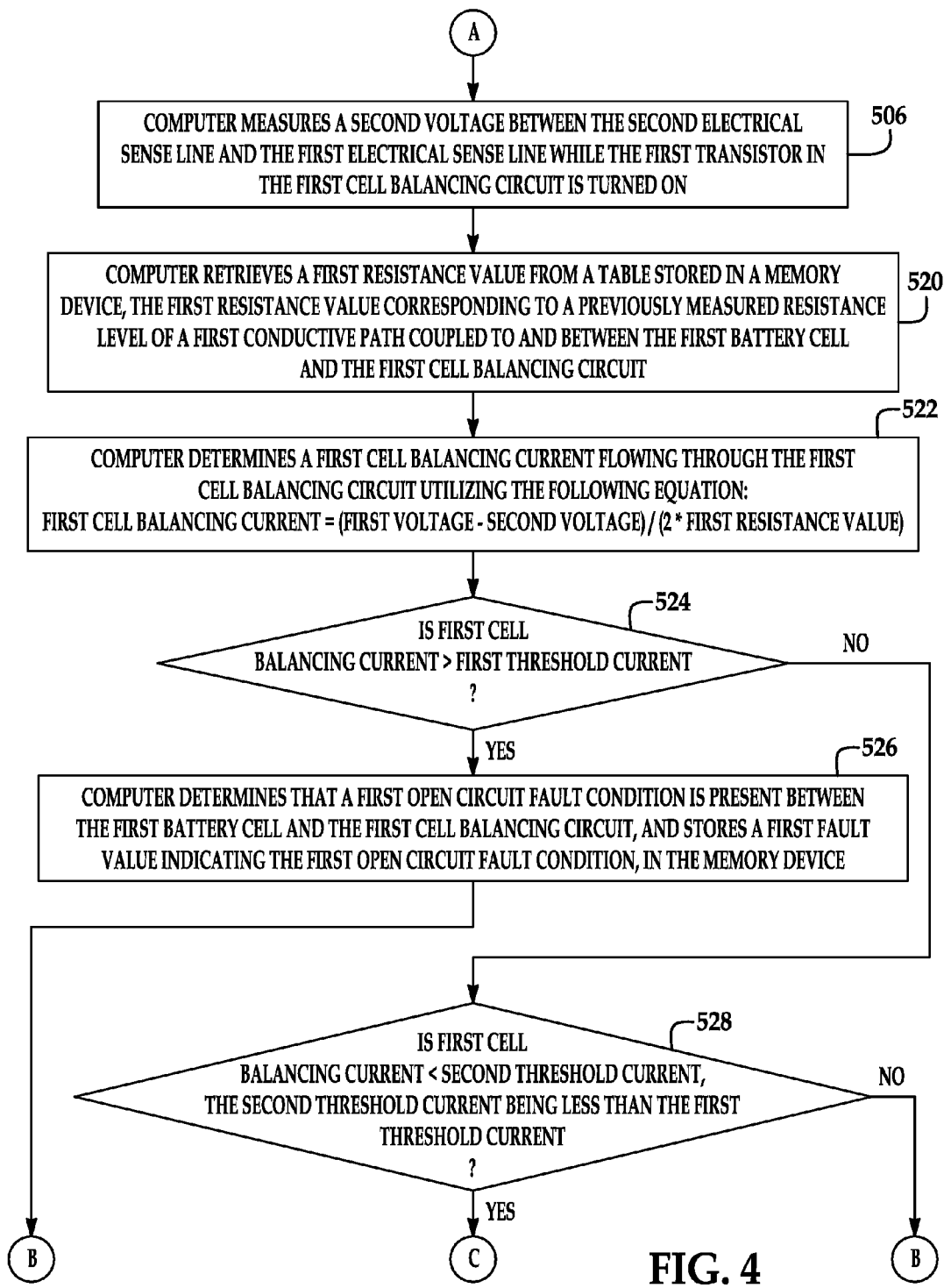

Referring to FIG. 1, a battery system 10 in accordance with an exemplary embodiment is provided. The battery system 10 includes a battery module 12 and a computer 14. The battery module 12 includes battery cells, 20, 22, and a monitoring circuit 30. An advantage of the battery module 12 is that the computer 14 is adapted to determine an open circuit fault condition between the first battery cell 20 and a first balancing circuit 90, and an open circuit fault condition between the second battery cell 22 and the second balancing circuit 92. Further, the computer 14 is adapted to determine an operational failure of a transistor in the first balancing circuit 90, and an operational failure of a transistor in the second balancing circuit 92.

An open circuit fault condition occurs when a normally conductive path is impaired or damaged and thereafter cannot conduct an electrical current therethrough as desired.

The first battery cell 20 includes a first electrical terminal 41 and a second electrical terminal 42. In an exemplary embodiment, the first battery cell 20 is a pouch-type lithium-ion battery cell. In an alternative embodiment, the first battery cell 20 is another type of battery cell known to those skilled in the art. The first battery cell 20 is adapted to be electrically coupled to the first balancing circuit 90 of the monitoring circuit 30 as will be explained in greater detail below.

The second battery cell 22 includes a first electrical terminal 51 and a second electrical terminal 52. In an exemplary embodiment, the second battery cell 22 is a pouch-type lithium-ion battery cell. In an alternative embodiment, the second battery cell 22 is another type of battery cell known to those skilled in the art. The second battery cell 22 is adapted to be electrically coupled to the second balancing circuit 92 of the monitoring circuit 30 as will be explained in greater detail below.

The monitoring circuit 30 is provided to electrically balance a state-of-charge of the battery cells 20, 22 and to monitor the battery cells 20, 22. The monitoring circuit 30 includes a circuit board 80, an electrical connector 82, the first balancing circuit 90, the second balancing circuit 92, and electrical sense lines 101, 102, 103.

The circuit board 80 is provided to hold the electrical connector 82, the first balancing circuit 90, the second balancing circuit 92, the electrical sense lines 101, 102, 103 thereon. The circuit board 80 may hold at least a portion of the computer 14 thereon.

The electrical connector 82 is provided to electrically couple the battery cells 20, 22 to the monitoring circuit 30. The electrical connector 82 includes a housing 110 and connector coupling portions 120, 122, 124, 126, 128, 130.

The connector coupling portions 120, 122 are configured to be removably coupled together for electrically coupling the first electrical terminal 41 of the first battery cell 20 (and the conductor 400) to the first balancing circuit 90.

The connector coupling portions 124, 126 are configured to be removably coupled together for electrically coupling the second electrical terminal 42 of the first battery cell 20 (and the conductor 401) to the first balancing circuit 90, and for electrically coupling the first electrical terminal 51 of the second battery cell 22 to the second balancing circuit 92.

The connector coupling portions 128, 130 are configured to be removably coupled together for electrically coupling the second electrical terminal 52 of the second battery cell 22 to the second balancing circuit 92.

The first balancing circuit 90 is adapted to selectively discharge current from the first battery cell 20 if an open circuit fault condition is not present between the first battery cell 20 and the first balancing circuit 90. The first balancing circuit 90 includes resistors 170, 172, 174, 176, 178, a transistor 190, a capacitor 194, a zener diode 198, an electrical line portion 210, and electrical nodes 240, 242, 244, 247, 248.

The transistor 190 is adapted to control a balancing current from the first battery cell 20. The transistor 190 includes a gate terminal G1, a drain terminal D1, a source terminal S1, and an internal diode DI1.

The electrical line portion 210 is coupled to and extends between the connector coupling portion 126 of electrical connector 22, and the electrical node 240 of the first balancing circuit 90. The resistor 170 is coupled to and extends between the electrical node 240 and the drain terminal D1 of the transistor 190. The source terminal S1 is coupled to the electrical node 246. The electrical node 246 is coupled to the electrical line portion 222 which is further coupled to the connector coupling portion 122. The gate terminal G1 is coupled to the electrical node 244. The resistor 174 is coupled between the electrical node 244 and electrical node 246, and is electrically coupled in parallel between the gate terminal G1 and the source terminal S1 of the transistor 190. The resistor 176 is coupled to and between the electrical node 244 and the computer 14 via the conductor 228. The resistor 178 is coupled to and between the electrical node 246 and the electrical node 248. The electrical node 248 is further electrically coupled through the sense line 101 to the computer 14. The resistor 172 is electrically coupled to and between the electrical node 240 and an electrical node 242. The electrical node 242 is further electrically coupled through the sense line 102 to the computer 14. The capacitor 194 is coupled to and between the electrical node 242 and electrical ground. Further, the zener diode 198 is coupled to and between the electrical node 242 and the electrical node 248, and is electrically coupled between the electrical sense lines 101, 102.

The computer 14 is programmed to perform the arithmetic and logical functions described herein. In a first embodiment, the computer 14 is composed of more than one computational unit, such as for example a first computational unit (e.g., Application Specific Integrated Circuit (ASIC)) that is coupled to the circuit board 80 and electrically coupled to the electrical sense lines 101, 102, 103 and the electrical lines 228, 328, and a second computational unit (e.g., microcontroller) that is disposed external to the circuit board 80, wherein the first computational unit (e.g., ASIC) operably communicates through a communication bus data including all measured voltage levels to the second computational unit (e.g., microcontroller). A microcontroller includes a microprocessor and a memory device. In the first embodiment, the microcontroller and the ASIC would be jointly construed as a computer herein. Further, in the first embodiment, the steps described in the flowchart of FIGS. 3-6 relating to measuring voltages and generating control signals to control the transistors would be performed by the ASIC, and the steps relating to retrieving resistance values, determining cell balancing currents, determining open circuit fault conditions, determining operational failures of transistors, and storing fault values, would be performed by the microcontroller. In a second embodiment, the computer 14 is a single computational unit disposed on the circuit board 80.

During operation, the computer 14 is programmed to generate a control signal to turn on the transistor 190—and in response a balancing current flows from the first battery cell 20 through the connector coupling portions 124, 126 of the electrical connector 82 and further through the resistor 170 and the transistor 190, and still further through the connector coupling portions 120, 122, and back to the first battery cell 20, if an open circuit fault condition is not present between the first battery cell 20 and the first balancing circuit 90. The computer 14 is further programmed to stop generating the control signal to turn off the transistor 190.

The second balancing circuit 92 is adapted to selectively discharge current from the second battery cell 22 if an open circuit fault condition is not present between the second battery cell 22 and the second balancing circuit 92. The second balancing circuit 92 includes resistors 270, 272, 274, 276, a transistor 290, a capacitor 294, a zener diode 298, electrical line portions 310, 323, and electrical nodes 340, 342, 344, 346.

The transistor 290 is adapted to control a balancing current from the second battery cell 22. The transistor 290 includes a gate terminal G2, a drain terminal D2, a source terminal S2, and an internal diode DI2.

The electrical line portion 310 is coupled to and extends between the connector coupling portion 130 of electrical connector 22, and the electrical node 340 of the second balancing circuit 92. The resistor 270 is coupled to and extends between the electrical node 340 and the drain terminal D2 of the transistor 290. The source terminal S2 is coupled to the electrical node 346. The electrical line portion 323 is coupled to and between the electrical node 346 and the electrical node 240. The gate terminal G2 is coupled to the electrical node 344. The resistor 274 is coupled to and between the electrical node 344 and electrical node 346, and is electrically coupled in parallel between the gate terminal G2 and the source terminal S2 of the transistor 290. The resistor 276 is coupled to and between the electrical node 344 and the computer 14 via the conductor 328. The resistor 272 is electrically coupled to and between the electrical node 340 and an electrical node 342. The electrical node 342 is further electrically coupled through the sense line 103 to the computer 14. The capacitor 294 is coupled to and between the electrical node 342 and electrical ground. Further, the zener diode 298 is coupled to and between the electrical node 342 and the electrical node 242, and is electrically coupled between the electrical sense lines 103, 102.

During operation, the computer 14 is programmed to generate a control signal to turn on the transistor 290—and in response a balancing current flows from the second battery cell 22 through the connector coupling portions 128, 130 of the electrical connector 82 and further through the resistor 270 and the transistor 290, and still further through the connector coupling portions 126, 124, and back to the second battery cell 22, if an open circuit fault condition is not present between the second battery cell 22 and the second balancing circuit 92. The computer 14 is further programmed to stop generating the control signal to turn off the transistor 290.

An overview of the methodology for determining an open circuit fault condition associated with the first battery cell 20 and the first balancing circuit 90 will now be explained. A similar methodology is utilized to determine an open circuit fault condition associated with the second battery cell 22 and the second balancing circuit 92. The methodology makes an assumption that a resistance of a conductive path between the second terminal 42 of the first battery cell 20 and the electrical node 240 of the first balancing circuit 90 is substantially equal to a resistance of a conductive path between the first terminal 41 of the first battery cell 20 and the electrical node 246 of the first balancing circuit 90.

The resistance between the second terminal 42 of the first battery cell 20 and the electrical node 240 includes a resistance of an electrical conductor 401 coupled to and between the second terminal 42 and the coupling connector coupling portion 124, the resistance of the coupling connector portions 124, 126, and a resistance of the electrical line portion 210. The line resistance between the first terminal 41 of the first battery cell 20 and the electrical node 246 includes a resistance of an electrical conductor 400 coupled to and between the first terminal 41 and the coupling connector coupling portion 120, a resistance of the coupling connector portions 120, 122, and a resistance of the electrical line portion 222.

Further, applicant has determined that when a cell balancing current flowing through the first balancing circuit 90 is greater than a first threshold current, an open circuit fault condition is present between either the second terminal 42 of the first battery cell 20 and the electrical node 240, or the first terminal 41 of the first battery cell 20 and the electrical node 246. Still further, the applicant has determined that when a cell balancing current flowing through the first balancing circuit 90 is less than a second threshold current (which is less than the first threshold current), an operational failure of the transistor 90 has occurred.

The cell balancing current in the flow balancing circuit 91 is determined based on voltages on the electrical sense lines 100, 102, and a pre-measured resistance between either the second terminal 42 of the first battery cell 20 and the electrical node 240, or a pre-measured resistance between the first terminal 41 of the first battery cell 20 and the electrical node 246.

Figure 5:
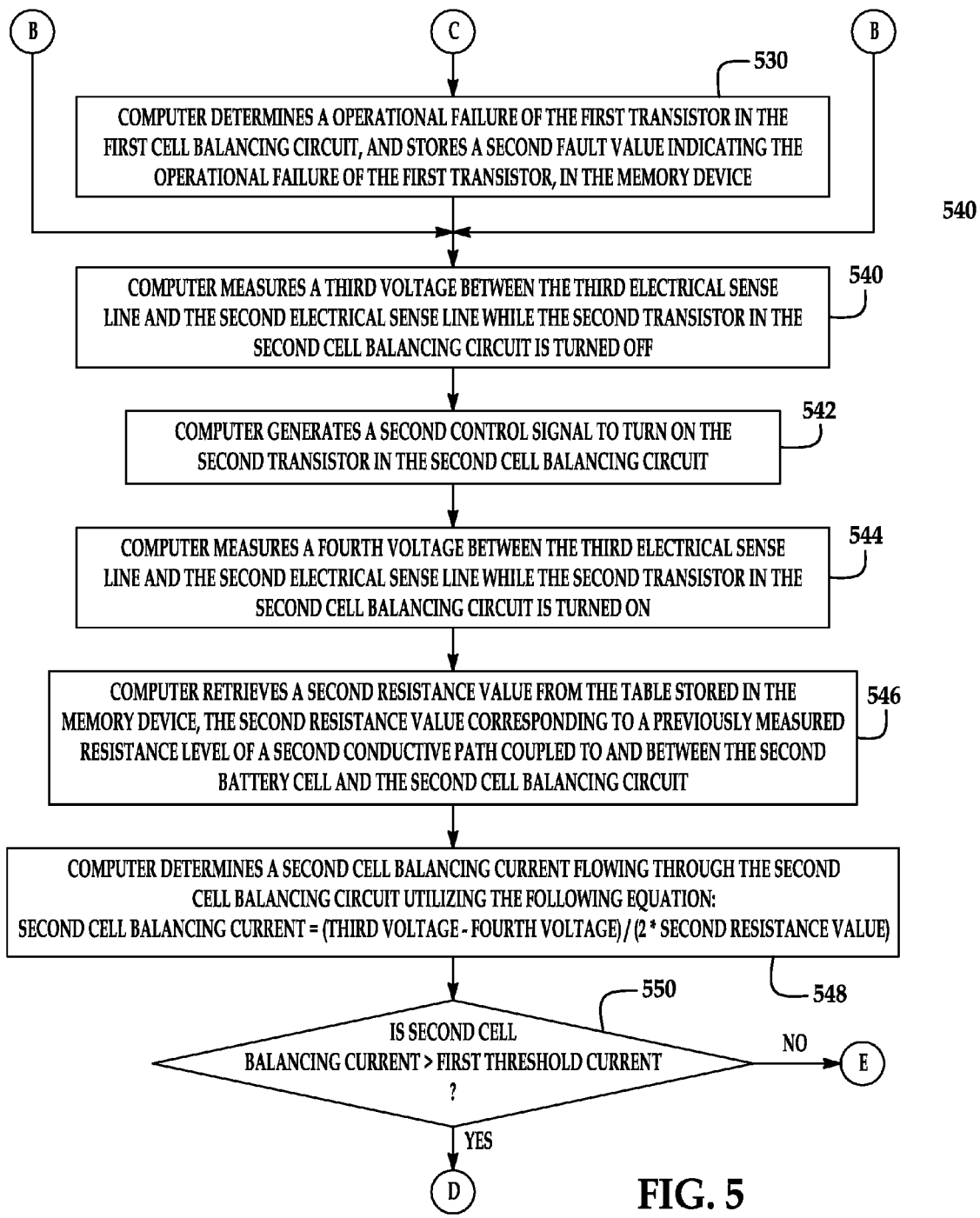
Figure 6:
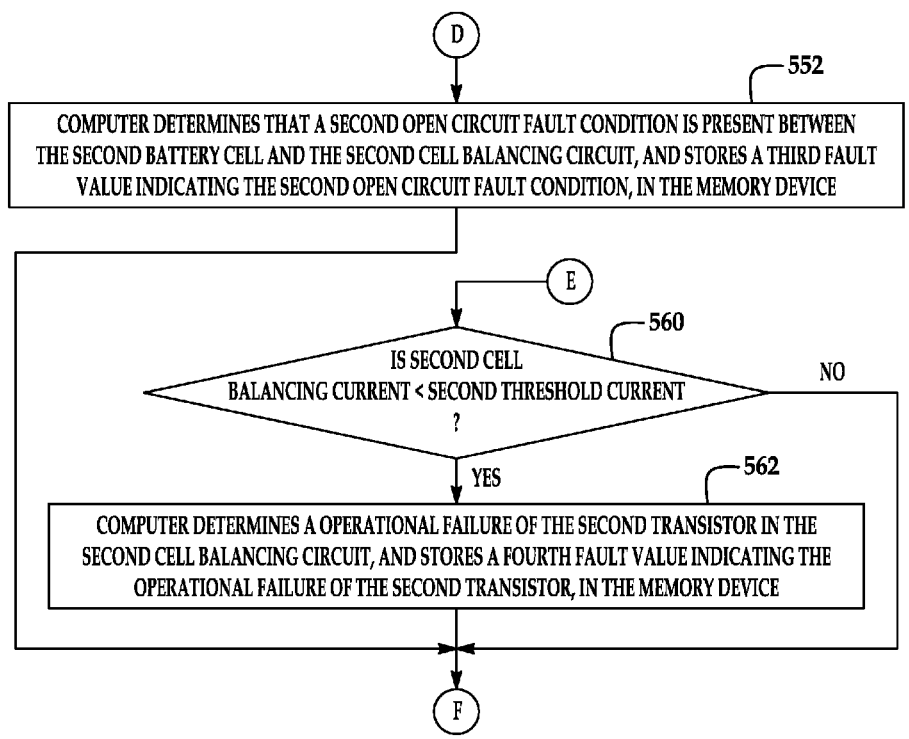

Referring to FIG. 5, an exemplary table 450 106 that has pre-measured resistance values utilized by the computer for determining balancing currents in the first and second balancing circuits 90, 92 are shown. The table 450 is stored in the memory device 107 and includes records 452, 454. The record 452 includes an average resistance value between the second terminal 42 of the first battery cell 20 and the electrical node 240, which is utilized by the computer 14 to determine the cell balancing current in the first balancing circuit 90. Further, the record 454 includes an average resistance value between the second terminal 52 of the second battery cell 22 and the electrical node 340, which is utilized by the computer 14 to determine the cell balancing current in the second balancing circuit 92.

Referring to FIGS. 1 and 3-6, a flowchart of a method for determining an open circuit fault condition in the battery module 12 in accordance with another exemplary embodiment will now be explained.

At step 500, a user provides the battery module 12 and the computer 14. The battery module 12 has the first and second battery cells, 20, 22, the first and second cell balancing circuits, 90, 92. The first battery cell 20 has the first and second electrical terminals 41, 42. The first electrical terminal 41 of the first battery cell 20 is electrically coupled to the first electrical sense line 101 if there is not an open circuit fault condition therebetween. The second electrical terminal 42 of the first battery cell 20 is electrically coupled to the second electrical sense line 102 if there is not an open circuit fault condition therebetween. The first cell balancing circuit 90 is electrically coupled to the first and second electrical sense lines 101, 102. The first cell balancing circuit 90 has the transistor 190 therein. The second battery cell 22 has the first and second electrical terminals 51, 52. The first electrical terminal 51 of the second battery cell 22 is electrically coupled to the second electrical sense line 102 if there is not an open circuit fault condition therebetween. The second electrical terminal 52 of the second battery cell 22 is electrically coupled to the third electrical sense line 103 if there is not an open circuit fault condition therebetween. The second cell balancing circuit 92 is electrically coupled to the second and third electrical sense lines 102, 103. The second cell balancing circuit 92 has a transistor 290 therein. The computer 14 is electrically coupled to the first, second, and third electrical sense lines 101, 102, 103, and to the first and second transistors 190, 290. After step 500, the method advances to step 502.

At step 502, the computer 14 measures a first voltage between the second electrical sense line 102 and the first electrical sense line 101 while the transistor 190 in the first cell balancing circuit 90 is turned off. After step 502, the method advances to step 504.

At step 504, the computer 14 generates a first control signal to turn on the transistor 190 in the first cell balancing circuit 90. After step 504, the method advances to step 506.

At step 506, the computer 14 measures a second voltage between the second electrical sense line 102 and the first electrical sense line 101 while the transistor 190 in the first cell balancing circuit 90 is turned on. After step 506, the method advances to step 520.

At step 520, the computer 14 retrieves a first resistance value from the table 450 (shown in FIG. 2) stored in the memory device 107. The first resistance value corresponds to a previously measured resistance level of the first conductive path coupled to and between the first battery cell 20 and the first cell balancing circuit 92. After step 520, the method advances to step 522.

At step 522, the computer 14 determines a first cell balancing current flowing through the first cell balancing circuit 90 utilizing the following equation: first cell balancing current=(first voltage−second voltage)/(2*first resistance value). After step 522, the method advances to step 524.

At step 524, the computer 14 makes a determination as to whether the first cell balancing current is greater than a first threshold current. If the value of step 524 equals "yes", the method advances to step 526. Otherwise, the method advances to step 528.

At step 526, the computer 14 determines that a first open circuit fault condition is present between the first battery cell 20 and the first cell balancing circuit 90, and stores a first fault value indicating the first open circuit fault condition, in the memory device 107. After step 526, the method advances to step 540.

Referring again to step 524, if the value step 524 equals "no", the method advances to step 528. At step 528, the computer 14 makes a determination as to whether the first cell balancing current is less than a second threshold current, wherein the second threshold current is less than the first threshold current. If the value of step 528 equals "yes", the method advances to step 530. Otherwise, the method advances to step 540.

At step 530, the computer 14 determines an operational failure of the transistor 190 in the first cell balancing circuit 90, and stores a second fault value indicating the operational failure of the transistor 190, in the memory device 107. After step 530, the method advances to step 540.

At step 540, the computer 14 measures a third voltage between the third electrical sense line 103 and the second electrical sense line 102 while the transistor 290 in the second cell balancing circuit 92 is turned off. After step 540, the method advances to step 542.

At step 542, the computer 14 generates a second control signal to turn on the transistor 290 in the second cell balancing circuit 92. After step 542, the method advances to step 544.

At step 544, the computer 14 measures a fourth voltage between the third electrical sense line 103 and the second electrical sense line 102 while the transistor 290 in the second cell balancing circuit 92 is turned on. After step 544, the method advances to step 546.

At step 546, the computer 14 retrieves a second resistance value from the table 450 stored in the memory device 107. The second resistance value corresponds to a previously measured resistance level of a second conductive path coupled to and between the second battery cell 22 and the second cell balancing circuit 92. After step 546, the method advances to step 548.

At step 548, the computer 14 determines a second cell balancing current flowing through the second cell balancing circuit utilizing the following equation: second cell balancing current=(third voltage−fourth voltage)/(2*second resistance value). After step 548, the method advances to step 550.

At step 550, the computer 14 makes a determination as to whether the second cell balancing current is greater than the first threshold current. If the value of step 550 equals "yes", the method advances step 552. Otherwise, the method advances to step 560.

At step 552, the computer 14 determines a second open circuit fault condition between the second battery cell 22 and the second cell balancing circuit 92, and stores a third fault value indicating the second open circuit fault condition, in the memory device 107. After step 552, the method returns to step 502.

Referring again to step 550, if the value step 550 equals "no", the method advances to step 560. At step 560, the computer 14 makes a determination as to whether the second cell balancing current is less than the second threshold current. If the value of step 560 equals "yes", the method advances to step 562. Otherwise, the method returns to step 502.

At step 562, the computer 14 determines an operational failure of the transistor 290 in the second cell balancing circuit 92, and stores a fourth fault value indicating the operational failure of the transistor 290, in the memory device 107. After step 562, the method returns to step 502.

The above-described method can be at least partially embodied in the form of one or more memory devices or computer readable media having computer-executable instructions for practicing the methods. The memory devices can comprise one or more of the following: hard drives, RAM memory, flash memory, and other computer-readable media known to those skilled in the art; wherein, when the computer-executable instructions are loaded into and executed by one or more computers or computers, the one or more computers or computers become an apparatus programmed to practice the associated steps of the method.

The battery system and the method described herein provide a substantial advantage over other battery systems and methods. In particular, an advantage of the battery system is that battery system is adapted to determine an open circuit fault condition between a first battery cell and a first balancing circuit in a battery module based on a resistance of a conductive path between the first battery cell and the first balancing circuit, and an open circuit fault condition between a second battery cell and a second balancing circuit based on a resistance of a conductive path between the second battery cell and the second balancing circuit. Further, the battery system is adapted to determine an operational failure of a transistor in the first balancing circuit, and an operational failure of a transistor in the second balancing circuit.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A battery system, comprising:
a battery module having a first battery cell, a first cell balancing circuit, a second battery cell, and a second balancing circuit;
the first battery cell having first and second electrical terminals, the first electrical terminal of the first battery cell being electrically coupled to a first electrical sense line if there is not an open circuit fault condition therebetween, the second electrical terminal of the first battery cell being electrically coupled to a second electrical sense line if there is not an open circuit fault condition therebetween;
the first cell balancing circuit being electrically coupled to the first and second electrical sense lines, the first cell balancing circuit having a first transistor therein;
the second battery cell having first and second electrical terminals, the first electrical terminal of the second battery cell being electrically coupled to the second electrical sense line if there is not an open circuit fault condition therebetween, the second electrical terminal of the second battery cell being electrically coupled to a third electrical sense line if there is not an open circuit fault condition therebetween;
the second cell balancing circuit being electrically coupled to the second and third electrical sense lines, the second cell balancing circuit having a second transistor therein;
a computer being electrically coupled to the first, second, and third electrical sense lines, and to the first and second transistors;
the computer programmed to measure a first voltage between the second electrical sense line and the first electrical sense line while the first transistor in the first cell balancing circuit is turned off;
the computer further programmed to generate a first control signal to turn on the first transistor in the first cell balancing circuit;
the computer further programmed to measure a second voltage between the second electrical sense line and the first electrical sense line while the first transistor in the first cell balancing circuit is turned on;
the computer further programmed to retrieve a first resistance value from a table stored in a memory device, the first resistance value corresponding to a previously measured resistance level of a first conductive path coupled to and between the first battery cell and the first cell balancing circuit;
the computer further programmed to determine a first cell balancing current flowing through the first cell balancing circuit based on the first and second voltages and the first resistance value; and
the computer further programmed to determine a first open circuit fault condition between the first battery cell and the first cell balancing circuit if the first cell balancing current is greater than a first threshold current.

2. The battery system of claim 1, wherein the computer further programmed to determine an operational failure of the first transistor in the first cell balancing circuit if the first cell balancing current is less than a second threshold current, the second threshold current being less than the first threshold current.

3. The battery system of claim 2, wherein:
the computer further programmed to store a first fault value indicating the first open circuit fault condition between the first battery cell and the first cell balancing circuit, in the memory device; and
the computer further programmed to store a second fault value indicating the operational failure of the first transistor in the first cell balancing circuit, in the memory device.

4. The battery system of claim 1, wherein the first conductive path being coupled to and between the first electrical terminal of the first battery cell and the first cell balancing circuit; and
the computer further programmed to determine the first open circuit fault condition in either the first conductive path coupled to and between the first electrical terminal of the first battery cell and the first cell balancing circuit, or in a second conductive path coupled to and between the second electrical terminal of the first battery cell and the first cell balancing circuit, if the first cell balancing current is greater than the first threshold current.

5. The battery system of claim 1, wherein:
the computer further programmed to measure a third voltage between the third electrical sense line and the second electrical sense line while the second transistor in the second cell balancing circuit is turned off;
the computer further programmed to generate a second control signal to turn on the second transistor in the second cell balancing circuit;
the computer further programmed to measure a fourth voltage between the third electrical sense line and the second electrical sense line while the second transistor in the second cell balancing circuit is turned on;
the computer further programmed to retrieve a second resistance value from the table stored in the memory device, the second resistance value corresponding to a previously measured resistance level of a second conductive path coupled to and between the second battery cell and the second cell balancing circuit;
the computer further programmed to determine a second cell balancing current flowing through the second cell balancing circuit based on the third and fourth voltages and the second resistance value; and
the computer further programmed to determine a second open circuit fault condition between the second battery cell and the second cell balancing circuit if the second cell balancing current is greater than the first threshold current.

6. The battery system of claim 5, wherein the computer further programmed to determine an operational failure of the second transistor in the second cell balancing circuit if the second cell balancing current is less than the second threshold current.

7. A method for determining an open circuit fault condition in a battery module, comprising:
providing the battery module and a computer, the battery module having first and second battery cells, and first and second cell balancing circuits; the first battery cell having first and second electrical terminals, the first electrical terminal of the first battery cell being electrically coupled to a first electrical sense line if there is not an open circuit fault condition therebetween, the second electrical terminal of the first battery cell being electrically coupled to a second electrical sense line if there is not an open circuit fault condition therebetween; the first cell balancing circuit being electrically coupled to the first and second electrical sense lines, the first cell balancing circuit having a first transistor therein; the second battery cell having first and second electrical terminals, the first electrical terminal of the second battery cell being electrically coupled to the second electrical sense line if there is not an open circuit fault condition therebetween, the second electrical terminal of the second battery cell being electrically coupled to a third electrical sense line if there is not an open circuit fault condition therebetween; the second cell balancing circuit being electrically coupled to the second and third electrical sense lines, the second cell balancing circuit having a second transistor therein; the computer being electrically coupled to the first, second, and third electrical sense lines, and to the first and second transistors;

measuring a first voltage between the second electrical sense line and the first electrical sense line while the first transistor in the first cell balancing circuit is turned off, utilizing the computer;

generating a first control signal to turn on the first transistor in the first cell balancing circuit utilizing the computer;

measuring a second voltage between the second electrical sense line and the first electrical sense line while the first transistor in the first cell balancing circuit is turned on, utilizing the computer;

retrieving a first resistance value from a table stored in a memory device, utilizing the computer; the first resistance value corresponding to a previously measured resistance level of a first conductive path coupled to and between the first battery cell and the first cell balancing circuit;

determining a first cell balancing current flowing through the first cell balancing circuit based on the first and second voltages and the first resistance value, utilizing the computer; and determining a first open circuit fault condition between the first battery cell and the first cell balancing circuit if the first cell balancing current is greater than a first threshold current, utilizing the computer.

8. The method of claim 7, further comprising storing a first fault value indicating the first open circuit fault condition between the first battery cell and the first cell balancing circuit in the memory device, utilizing the computer.

9. The method of claim 7, further comprising determining an operational failure of the first transistor in the first cell balancing circuit if the first cell balancing current is less than a second threshold current, utilizing the computer; the second threshold current being less than the first threshold current.

10. The method of claim 9, further comprising storing a second fault value indicating the operational failure of the first transistor in the first cell balancing circuit in the memory device, utilizing the computer.

11. The method of claim 7, further comprising:

measuring a third voltage between the third electrical sense line and the second electrical sense line while the second transistor in the second cell balancing circuit is turned off, utilizing the computer;

generating a second control signal to turn on the second transistor in the second cell balancing circuit, utilizing the computer;

measuring a fourth voltage between the third electrical sense line and the second electrical sense line while the second transistor in the second cell balancing circuit is turned on, utilizing the computer;

retrieving a second resistance value from the table stored in the memory device, utilizing the computer, the second resistance value corresponding to a previously measured resistance level of a second conductive path coupled to and between the second battery cell and the second cell balancing circuit;

determining a second cell balancing current flowing through the second cell balancing circuit based on the third and fourth voltages and the second resistance value, utilizing the computer; and determining a second open circuit fault condition between the second battery cell and the second cell balancing circuit if the second cell balancing current is greater than the first threshold current, utilizing the computer.

12. The method of claim 11, further comprising determining an operational failure of the second transistor in the second cell balancing circuit if the second cell balancing current is less than the second threshold current, utilizing the computer.

* * * * *